United States Patent [19]
McLaury

[11] Patent Number: 5,612,922
[45] Date of Patent: Mar. 18, 1997

[54] PAGE MODE EDITABLE REAL TIME READ TRANSFER

[75] Inventor: Loren L. McLaury, Boise, Id.

[73] Assignee: Micron Technology, Inc., Boise, Id.

[21] Appl. No.: 498,178

[22] Filed: Jul. 5, 1995

[51] Int. Cl.⁶ .................................................. G11C 8/00
[52] U.S. Cl. .............................. 365/230.05; 365/230.09; 365/238.5
[58] Field of Search .................... 365/230.05, 238.5, 365/239, 230.09

[56] References Cited

U.S. PATENT DOCUMENTS

| | | | |
|---|---|---|---|
| 5,179,372 | 1/1993 | West et al. | 365/230.05 |
| 5,208,775 | 5/1993 | Lee | 365/239 |
| 5,235,545 | 8/1993 | McLaury | 365/189.04 |
| 5,265,050 | 11/1993 | McLaury | 365/189.01 |
| 5,282,177 | 1/1994 | McLaury | 365/230.05 |
| 5,287,324 | 2/1994 | Nagashima | 365/230.05 |
| 5,311,478 | 5/1994 | Zagar et al. | 365/230.06 |
| 5,319,603 | 6/1994 | Watanabe et al. | 365/230.05 |
| 5,325,502 | 6/1994 | McLaury | 395/425 |
| 5,369,622 | 11/1994 | McLaury | 365/233 |

Primary Examiner—David C. Nelms
Assistant Examiner—Huan Hoang
Attorney, Agent, or Firm—Schwegman, Lundberg, Woessner & Kluth, P.A.

[57] ABSTRACT

An integrated memory circuit is presented for real time read transfers of data. The integrated memory circuit includes a dynamic random access memory (DRAM) and a serial memory. The integrated memory circuit can be used to randomly access data locations in a row of the DRAM and then transfer the entire row to the serial memory. These two functions can be performed in one memory row access cycle to eliminate time consuming pre-charge operations. The random access operations can include both reading from, and writing to the DRAM. Newly written data can be transferred to the serial memory for external communication.

20 Claims, 15 Drawing Sheets

PAGE MODE EDITABLE REAL TIME READ TRANSFER

TECHNICAL FIELD OF THE INVENTION

The present invention relates generally to integrated circuit memories and in particular the present invention relates to memory circuits which have a dynamic memory and a static memory. More particularly, the present invention relates to transfers of data from the dynamic memory to the static memory.

BACKGROUND OF THE INVENTION

FIG. 1 illustrates a simplified block diagram of the basic elements of a prior art multi-port memory similar to the memory described in U.S. Pat. No. 4,891,794 issued to Hush et al. entitled "Three Port Random Access Memory" which is incorporated herein by reference. Multi-port random access memories (RAM) are substantially faster than standard RAM and commonly referred to as video random access memories (VRAM) because of their effectiveness in video systems.

In its simplest form, the multi-port memory includes a dynamic random access memory (DRAM) 100 having input/output lines 101, a DRAM controller 102, two serial access memories (SAM) 104 and 106 and a SAM controller 108. Each SAM is essentially a long shift register which can receive a block of data from the DRAM and serially shift the data out through data port 107 or 109. Each SAM can also serially shift data in through the serial ports and transfer the data to the DRAM. Other multi-port memories may include a different number of serial access memories. For example, a dual port memory incorporates one input SAM and a DRAM.

The DRAM is a dynamic array for storing multiple bit registers in multiple two dimensional planes each having rows and columns. Each bit register is defined by the same row and column addresses in each of the planes. Each SAM has a bit register row associated with one of each of the planes of the DRAM such that the columns of the DRAM correspond to the bits of the register row.

In general, the DRAM and SAM's can operate either independently or in limited combinations for internal transfers of data. When operating in combination, the SAM's are structured to allow each SAM to access one row of the DRAM. Assuming, in a DRAM having 512 column addresses in each row, SAM 104 can read or write to addresses 0–511 of one row of the DRAM and SAM 106 can read or write to addresses 0–511 of one row of the DRAM. This configuration allows for both bi-directional internal transfer of data between the DRAM and the SAM's and independent access to each of the three memories.

Transferring data from a SAM to the DRAM requires the addressing of a given row of the DRAM in which the data is to be transferred. Addressing a row, as known to one skilled in the art, requires pre-charging the row. Once data has been transferred to cells in a row, prior art teaches that the row must be inhibited or closed, see U.S. Pat. No. 4,689,741 to Redwine et al., entitled "Video System having Dual-port Memory with Inhibited Random Access During Transfer Cycles", and U.S. Pat. No. 4,667,313 to Pinkham et al., entitled "Serially Accessed Semiconductor Memory with Tapped Shift Register." If the newly transferred data is to be randomly accessed, the row must therefore be pre-charged and re-addressed. The re-addressing of newly transferred data is time consuming and prevents real time editing of that data.

Further, the row access signal used to access a given row of the DRAM is used to trigger functions other than data transfers. These functions include functions not directly related to a row of memory, for example loading either a mask or color register. To perform these functions, however, a DRAM row must be accessed. The row is then closed upon completion of the function. To speed the operation of the memory, it would be advantageous to access a row of the DRAM, perform a function (related or not related to the accessed row), and then perform a function related to the row without being required to close the row.

To transfer data from a DRAM to a SAM requires the addressing of a given row of the DRAM in which the data is to be transferred. Again, addressing a row requires that the row be pre-charged. If the DRAM data needs to be manipulated in some manner prior to transferring the data to the SAM, a separate write operation is required. For example, if parity data needs to be generated for data stored in a row of the DRAM, the data must first be read from the memory. Parity data is then generated by external circuitry and the parity data can then be stored in a separate location in the same memory row. These read and write operations can be performed using page mode operations. That is, the row of memory remains addressed while the column address is changed to allow random access for these different operations. When the parity data has been stored in the DRAM, the memory row is closed. The memory row must be pre-charged and addressed again to transfer this newly manipulated data from the DRAM memory row to a SAM register.

For the reasons stated above, and for other reasons stated below which will become apparent to those skilled in the art upon reading and understanding the present specification, there is a need in the art for a memory circuit which can perform multiple functions while a row of the memory is accessed. There is also a need for a multi-port memory which can transfer data from a DRAM to a SAM immediately following real-time random access to the data.

SUMMARY OF THE INVENTION

The above mentioned problems with DRAM data manipulation and transfer and other problems are addressed by the present invention and which will be understood by reading and studying the following specification. A memory circuit is described which allows a dynamic memory to be read from and written to during a row access cycle, and then immediately transferred to a static memory during the same row access cycle. This allows random access to the dynamic memory for last second changes or additions to the stored data prior to transferring the data to the static memory.

In particular, the present invention describes a memory device which comprises both a dynamic memory having memory cells arranged in rows, and a static memory selectively coupled to the dynamic memory. A data input is coupled to the dynamic memory for transmitting new data to the dynamic memory. Further, a controller is provided for accessing one of the rows of the dynamic memory, storing the new data in the accessed row, and transferring the new data from the accessed row to the static memory.

A memory device is also provided which comprises a dynamic memory having memory cells arranged in rows and columns, and a static memory selectively coupled to the dynamic memory. The memory device also includes a row access strobe input (RAS) for addressing one of the rows, and a controller for both randomly accessing the addressed row and substantially immediately transferring data stored in memory cells of the addressed row to the static memory. In another embodiment, the memory device includes a column access strobe (CAS) input to address at least one of the columns, a serial memory tap address register, and a real time read transfer circuit. The real time read transfer circuit inhibits a cycle of the column access strobe (CAS) input to load data into the serial memory tap address register. Further, the real time read transfer circuit can produce an output coupled to the control logic for performing a second strobe function of the additional inputs. The real time read transfer circuit can also include an input for enabling the real time read transfer circuit.

In an alternate embodiment, a method is described for internally transferring data in a memory device comprised of dynamic memory and an additional memory. The method comprising the steps of addressing one row of the dynamic memory, randomly accessing the dynamic memory, transferring data between the dynamic memory and the additional memory, and closing the row of the dynamic memory. The step of randomly accessing the dynamic memory can include both reading data from the dynamic memory and writing data to the dynamic memory. Further, the additional memory can be a static memory.

A method is provided for performing a plurality of functions in a memory device having a random access memory (RAM) having memory cells arranged in rows and columns, and an additional memory. The method comprises the steps of addressing one of the rows using a row access strobe (RAS) input, strobing additional inputs based upon the RAS input, and accessing a column using a column access strobe (CAS) input. The method also includes the steps of performing either page mode read or write operations on the RAM during the RAS cycle, and performing a read transfer from the RAM to the additional memory during the RAS cycle.

In yet another embodiment, a method is provided for performing a plurality of functions in a multi-port memory device having a random access memory (RAM) array arranged in rows and columns, and an additional memory. The method comprises the steps of addressing one row using a row access strobe (RAS) input, strobing additional inputs based upon the RAS input, and disabling page mode functions. The method further includes loading a serial tap address using a column access strobe (CAS) input, re-enabling page mode functions, and performing read or write page mode functions. The final step involves performing a transfer function to transfer data between the RAM and the additional memory.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

This invention concerns electrical circuitry which uses voltages to represent the two binary logic levels. The words "low" and "high" in this specification refer generally to the false and true binary logic levels, respectively. Signals are generally considered active when they are high, however, an asterisk (*) following the signal name, or a bar above the signal name in this application indicates that the signal is negative or inverse logic. Negative or inverse logic is considered active when the signal is low.

The present invention provides extended modes of operation in memories which allow for access to locations in the memory for reading or storing new data and then transferred the data to another memory. Specifically, multiple functions can be performed while accessing a row of memory without the need to close the row following each function.

Figure 1:
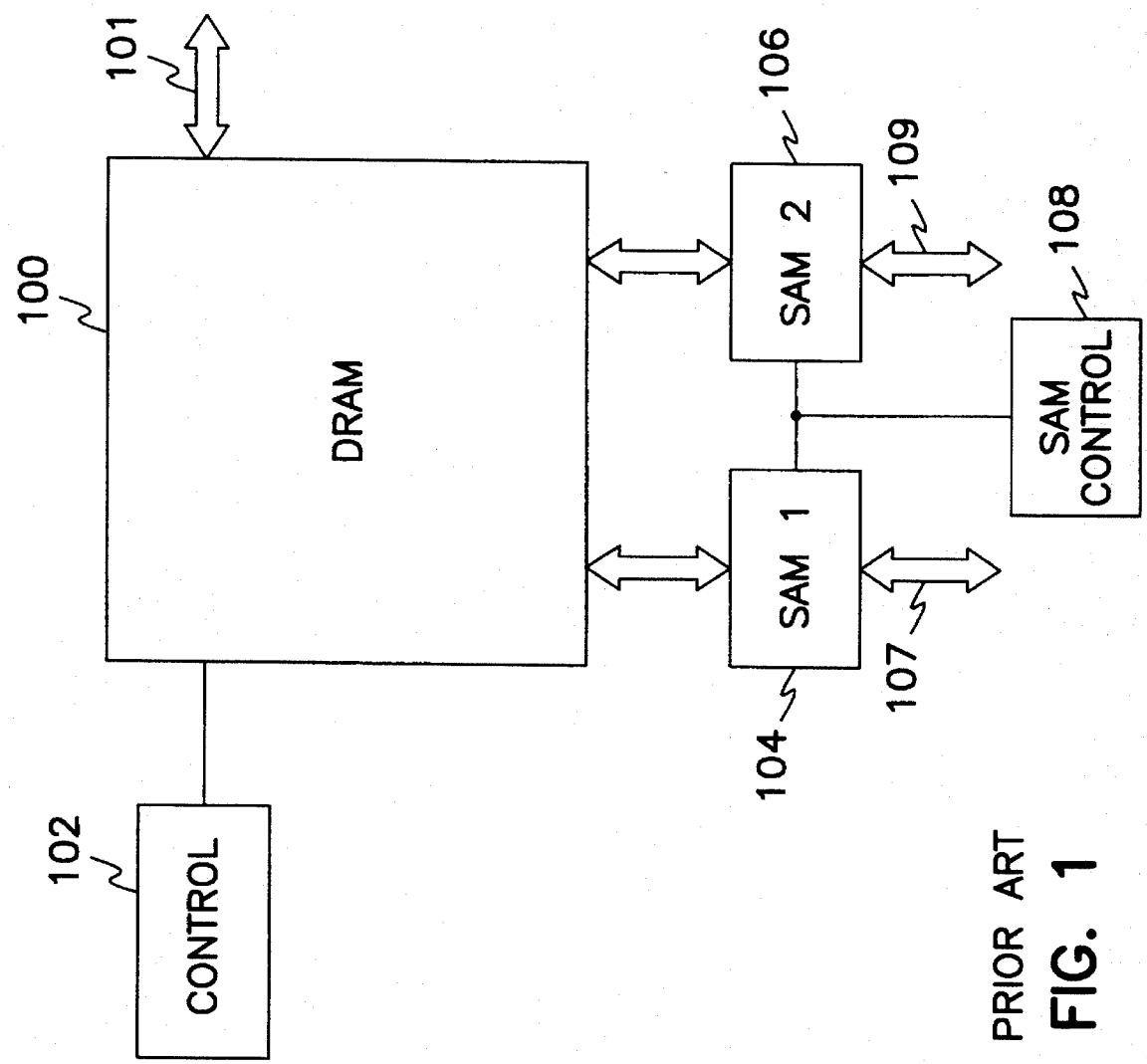
FIG. 1 is a simplified block diagram of a prior art multi-port memory.
Figure 2:
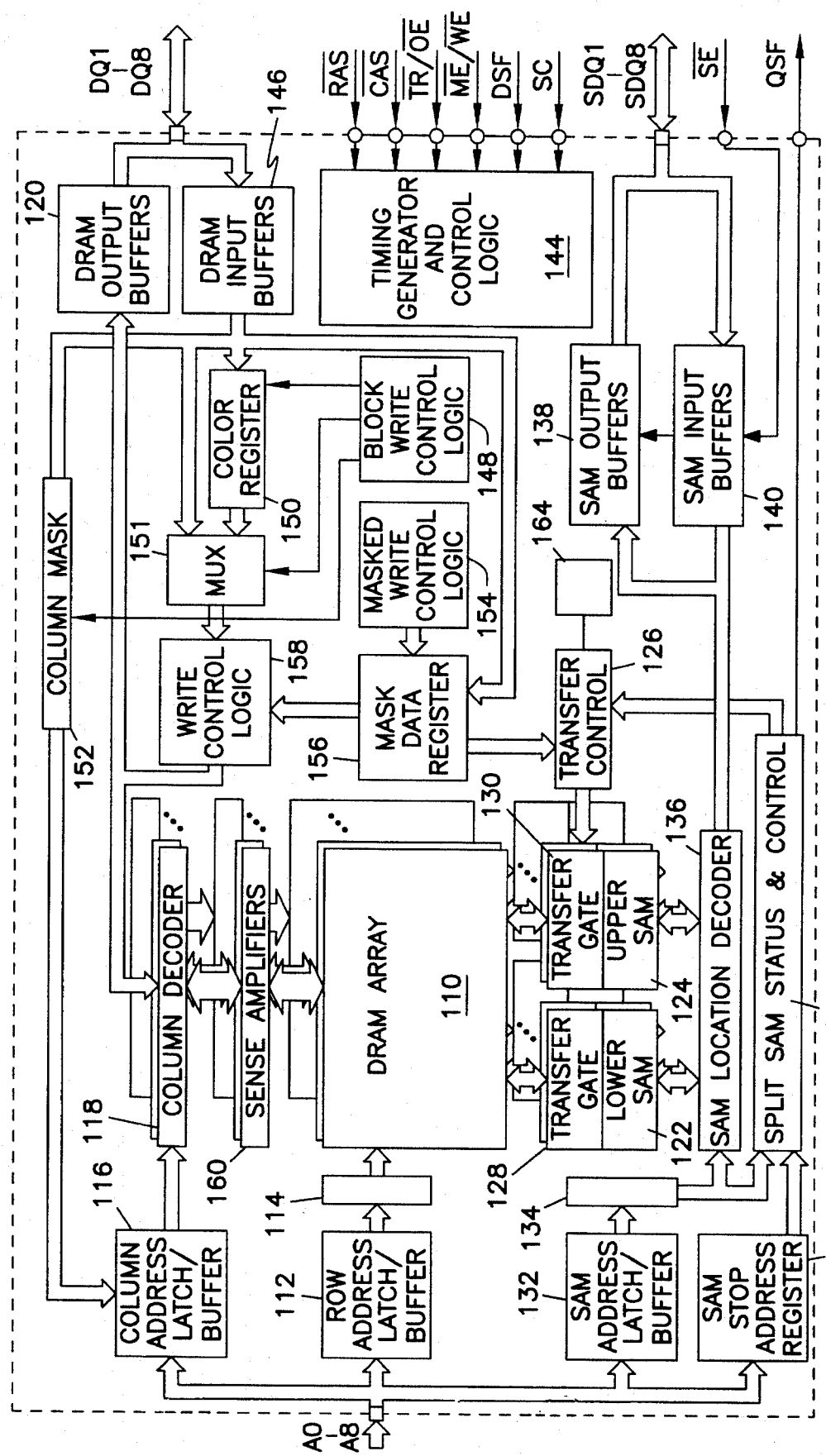
FIG. 2 is a detailed block diagram of the multi-port memory incorporating the present invention.

FIG. 2 illustrates a block diagram of a multi-port memory incorporating the present invention. The multi-port memory incorporating the present invention is similar to the VRAM available as part number MT42C8256 produced by Micron Technology Inc., Boise, Idaho, the assignee of the present invention. A complete description of this memory can be found in Micron Semiconductor, Inc. Data Book, page 2-139 to 2-179 (1993).

DRAM 110 is a 512 by 512 by 8 bit array which can be accessed by a microprocessor (not shown) through input/output connections including address lines A0–A8. Row address latch/buffer 112 and row decoder 114 decode a row address from a row address signal provided on A0–A8, and address the corresponding row of the DRAM. Likewise, column address latch/buffer 116 and column decoder 118 decode a column address from a column address signal provided on A0–A8, and address the corresponding column of the DRAM. Data stored in the DRAM 110 can be transferred to outputs DQ1–DQ8 through DRAM output buffers 120.

Two 256×8 bit serial access memories, SAM's 122 and 124, are provided as independent memories and connected to the DRAM for internal transfers of data. SAM 122 is dedicated to internal transfers with DRAM 110 column addresses 0 through 255 and SAM 124 is dedicated to internal transfers with column addresses 256 through 511 of any given row. DRAM 110 and SAM's 122 and 124 can operate as described above either independently or in limited combination for internal data transfers. Transfer control circuit 126 controls the internal transfer of data between the SAM's and the DRAM using transfer gates 128 and 130. The address location of the SAM's are controlled through address lines A0–A8 using SAM address latch/buffer 132, SAM address counter 134 and SAM location decoder 136. SAM serial output is provided on lines SDQ1–SDQ8 through SAM output buffers 138. Likewise, serial input to the SAM's are controlled on lines SDQ1–SDQ8 through SAM input buffer 140. Split SAM status and control 137 provides SAM status feedback to the transfer control 126.

Timing generator and control logic 144 is used to control the many available functions of DRAM 110. DRAM data input is provided on lines DQ1–DQ8 through DRAM input buffers 146. MUX 151 multiplexes the DQ input lines and the color register 150 to write control logic 158. Block write control logic 148, color register 150 and column mask 152 are used to control custom features of the multi-port memory, as described in detail below. Masked write control logic 154, masked data register 156, and write control logic 158 are used to control masking features, as described in detail below. Sense amplifiers 160 are used to detect and amplify data stored in the DRAM.

The present invention is described in a multi-port memory, however, it will be understood that any memory incorporating a random access memory array can be used without departing from the spirit of the present invention.

Input and Output Connections

The input and output connections of the multi-port memory used to communicate with a micro processor are described as follows. Serial clock input (SC) to the timing generator and control logic 144 provides the clock input for the SAM address latch/buffer 132 and SAM address counter 134 for each of the SAM memories. Transfer enable/output enable (TR*/OE*) input provides for the internal transfer of data between the DRAM and the SAM's and also enables the output buffers 120 of the DRAM. The masked enable/ write enable (ME*/WE*) input is used to perform a masked write function. The ME*/WE* can also be used to select a read or write cycle when accessing the DRAM, this includes a read transfer or write transfer with the SAM's. The serial port enable (SE*) input is used to enable the SAM input buffers 140 and output buffers 138. Special function select input (DSF) is used to indicate which special function (block write, flash write, split transfer, etc.) are used for a particular access cycle. Row address strobe (RAS*) input is used to clock in the nine row address bits and strobe for ME*/WE*, TR*/OE*, DSF, SE*, CAS*, and DQ inputs. In standard multi-port memories, the RATS* also acts as the master chip enable and must fall for the initiation of any DRAM or transfer function. Column address strobe (CAS*) input is used to clock in the nine column address bits and as a strobe for the DSF input for a block write function.

Address input lines A0–A8 are used to identify a row and column address to select at least one 8 bit word or register out of the 262,144 available words, as detailed above. DRAM data input / output lines DQ1–DQ8 provide data input and output for the DRAM and also act as inputs for mask data register 156 and color register 150. Serial data input / output lines SDQ1–SDQ8 provide data input and output to the SAM's 122 and 124. SAM's split status output (QSF) indicates which half of the SAM is being accessed, a low indicates addresses 0–255 are being accessed, while a high indicates addresses 256–511 are being addressed.

Multi-Port Functions

There are many modes or functions which can be performed using multi-port memories. In particular, some multi-port memory functions are: normal read or write (NR), a block write (BW) to the DRAM, a masked write (RWM) to the DRAM, a masked block write (BWM) to DRAM, a masked flash write (FWM) to DRAM, load mask register (LMR), load color register (LCR), masked write transfer (WT), a masked split write transfer (SWT), read transfer (RT), and split read transfer (SRT). Each of these functions are described below.

Normal random access read or write functions can be performed when a row and column are accessed. An eight bit data word can either be read from the DRAM or written to the DRAM using the DQ lines. Similarly, a page mode function allows the contents of a page, or "row plane", to be accessed so that any word on that page can be read or written without closing the page.

Figure 3:
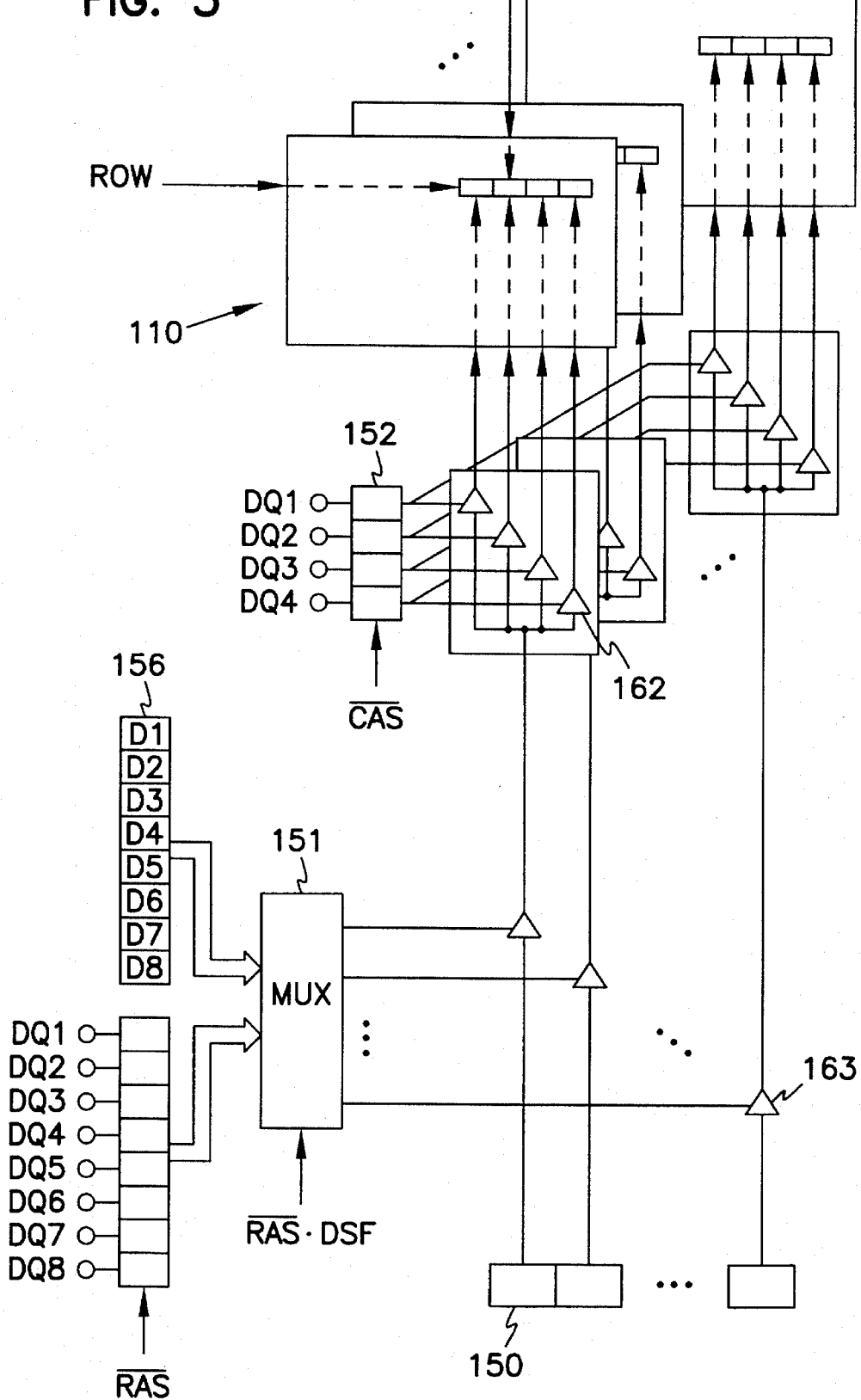
FIG. 3 illustrates a block write function in a DRAM.

The block write function is used to write the contents of the color register 150 directly to four adjacent column locations of the DRAM 110, see FIG. 3. The color register 150 must be loaded prior to beginning block write functions, see the load color register function described below. The DRAM row is addressed in the same way as a normal DRAM read or write, however, when CAS* goes low A2–A8 specify the block of four adjacent column locations that will be addressed. Column mask 152 and DQ1–DQ4 inputs can then be used to enable any or all of the four columns using enable gates 162 so that the contents of the color register can be written to the column locations which have been enabled. Each DQ location of the color register is written to the four column locations in the corresponding DQ bit plane.

A masked write function eliminates the need to do a read-modify-write function when changing individual bits within an eight bit word. During this function, data present on the DQ1–DQ8 inputs are written into the mask data register 156, on the falling edge of RAS*. The masked data acts as an individual write enable for each of the eight DQ1–DQ8 inputs. That is, if a low (logic 0) is written to a masked data register bit, the input port of that bit is disabled during the subsequent write function and no new data will be written to that DRAM cell location. A high (logic 1) at a masked data register bit enables the input port and allows for a write function to succeed.

The mask write can be combined with the block write function to provide a mask block write function as seen in FIG. 3. The masked block write function is the same as the normal mask write except the mask is now applied to enable a selected number of the eight planes. Mask data register 156 or the DQ lines can be used to enable the enable gates 163 so that color register 150 can be written to the DRAM. By using both the column mask 152 input and the mask write function any combination of the eight bit planes may be masked, along with any combination of the four column locations.

The masked flash write (FWM) function is similar to the masked block function in that it uses the color register to accelerate the writing of a select color to the DRAM memory array. Instead of writing to four adjacent column locations in one DRAM cycle, however, the FWM function writes the contents of the color register to all column locations on an addressed row.

The load mask register (LMR) function loads data present on the DQ input lines into the eight bit masked data register 156. Similarly, the load color register (LCR) function loads data present on the DQ input lines into the color register 150. The contents of the eight bit color register are retained until changed by another load color register function.

Figure 4:
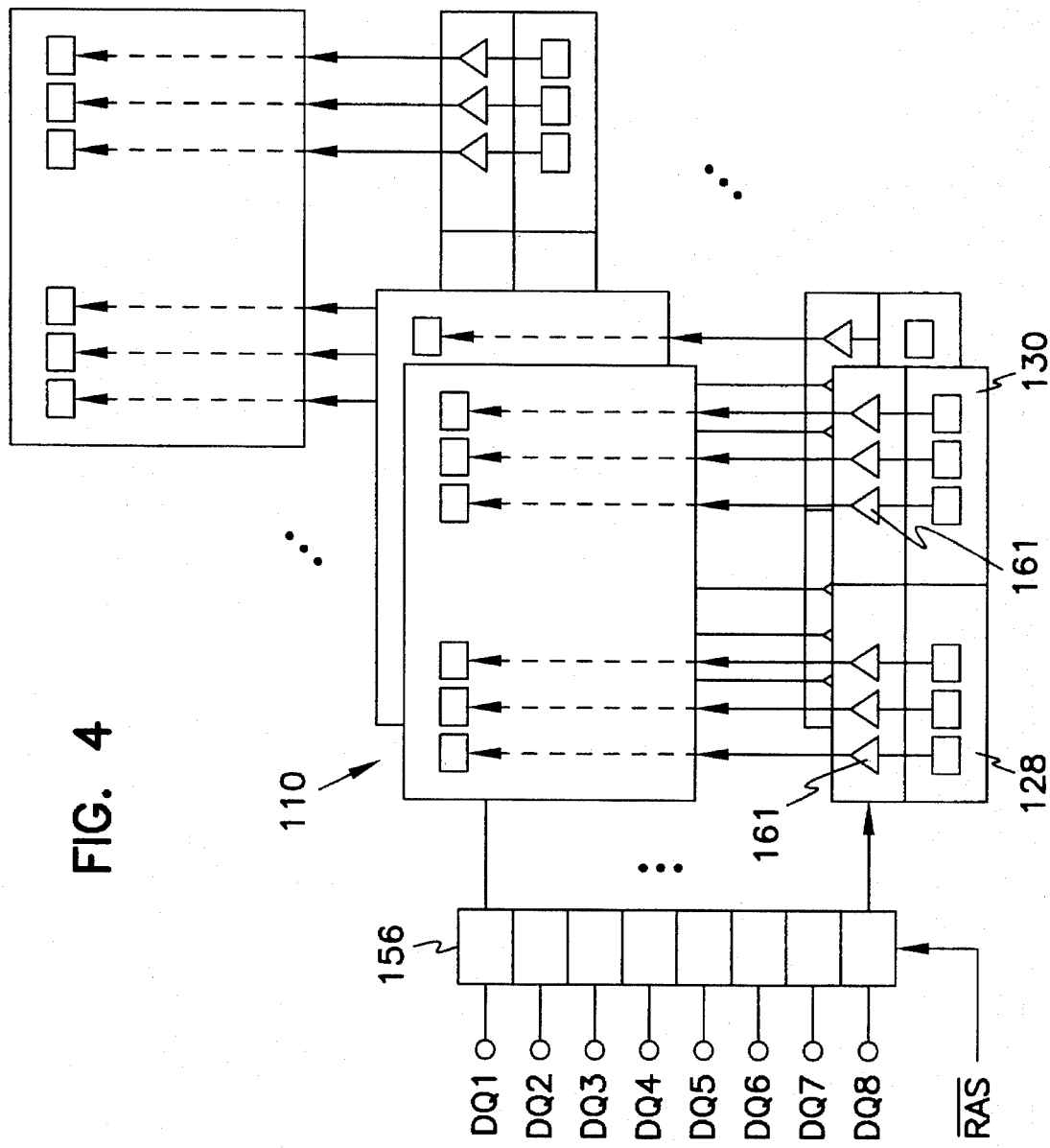
FIG. 4 illustrates a masked write transfer function in a DRAM.

Transfer functions WT and SWT are used to transfer data between the DRAM 110 and the SAM's 122, 124. These transfer functions are initiated when TR*/OE* is low at the falling edge of RAS*. The masked write transfer (WT) function is a SAM to DRAM transfer. A row address is provided on A0–A8 to indicate the DRAM row to which the SAM data registers will be written. A DQ mask must be applied to all WT's as shown in FIG. 4 to enable the SAM's corresponding to each DRAM plane using enable gates 161 of the SAM transfer gates 128 and 130. The mask write transfer therefore allows for SAM to DRAM transfer using the mask register 156.

The mask split write transfer (SWT) function allows serial input data to be transferred to the DRAM from a SAM. The function of the mask split write transfer is very similar to the write transfer described above. The SWT will transfer the idle half of the SAM to the DRAM and set the tap address to where the new serial data will be loaded in that half.

The read transfer (RT) function is a transfer from the DRAM to the SAM. The row address bits indicate which eight 512-bit DRAM row planes are transferred to the eight SAM data register planes. The column address bits indicate the start address, or tap address, of the serial output cycle from the SAM data registers. During the transfer, 4,096 bits of DRAM data are written into the SAM data registers and the tap address is stored in an internal 9-bit register 132.

The split-read transfer (SRT) eliminates the critical transfer timing required to maintain a continuous serial output data stream. When using the plait read transfer, the SAM is divided into an upper and a lower half. While data is being serially read from one half of the SAM, new DRAM data may be transferred to the other half. The transfer may occur at any time while the other half is sending data, and is not synchronized with the serial clock.

The above detailed functions of a multi-port memory are intended to provide an understanding of some of the available features and is not intended to be exhaustive. For more detail on the multi-port memory functions see Micron Semiconductor, Inc. Data Book, page 2-139 to 2-179 (1993).

Extended Functions with Simultaneous Access

Referring to Table 1, each of the functions described above are performed during a row access cycle. That is, when RAS* is active, or low. To insure data integrity, prior art requires that upon completion of one of the transfer functions, the accessed row must be closed before the data which was manipulated can be randomly accessed. Thus, the DRAM can not be immediately accessed upon completing a given transfer function. To access a row of data which was manipulated in some manner (read or written), therefore, the row must be closed and a new row access cycle started. One disadvantage of this method is that the row access cycle requires that the row to be accessed be pre-charged. Pre-charging digit line coupled to memory cells, as known to one skilled in the art, is a time consuming operation. In memories, in particular VRAMs, speed is critical and unnecessary steps must be avoided.

Isolation circuitry can be included with transfer control 126 which isolates the DRAM from the SAM immediately following a transfer there between. The isolation circuit includes a time trigger circuit 164 connected to transfer control 126. It will be understood that other triggers could be used. These can include logic circuits, unused input lines, or the addition of a new input line.

Additional features of the multi-port memory of the present invention are a page mode enable circuit which is used to enable page mode functions and a reallocation circuit included in timing generator and control logic 144 which "hands off" the strobe operation from the RAS* to the CAS* while RAS* is low.

TABLE 1

| CODE | FUNCTION | RAS* FALLING EDGE | | | | CAS* FALL DSF |
| --- | --- | --- | --- | --- | --- | --- |
| | | CAS* | TR*/OE* | ME*/WE* | DSF | |
| FLASH WRITE FUNCTIONS | | | | | | |
| FWM | Masked Flash Write to DRAM | 1 | 1 | 0 | 1 | X |
| REGISTER FUNCTIONS | | | | | | |
| LMR | Load Mask Register | 1 | 1 | 1 | 1 | 0 |
| LCR | Load Color Register | 1 | 1 | 1 | 1 | 1 |
| TRANSFER FUNCTIONS | | | | | | |
| WT | Masked Write Transfer | 1 | 0 | 0 | 0 | X |
| SWT | Masked Split Write Transfer | 1 | 0 | 0 | 1 | X |
| PAGE MODE FUNCTIONS | | | | | | |
| RW | Normal DRAM Read or Write | 1 | 1 | 1 | 0 | 0 |
| RWM | Masked Write to DRAM | 1 | 1 | 0 | 0 | 0 |
| BW | Block Write to DRAM | 1 | 1 | 1 | 0 | 1 |
| BWM | Masked Block Write to DRAM | 1 | 1 | 0 | 0 | 1 |

Figure 7:
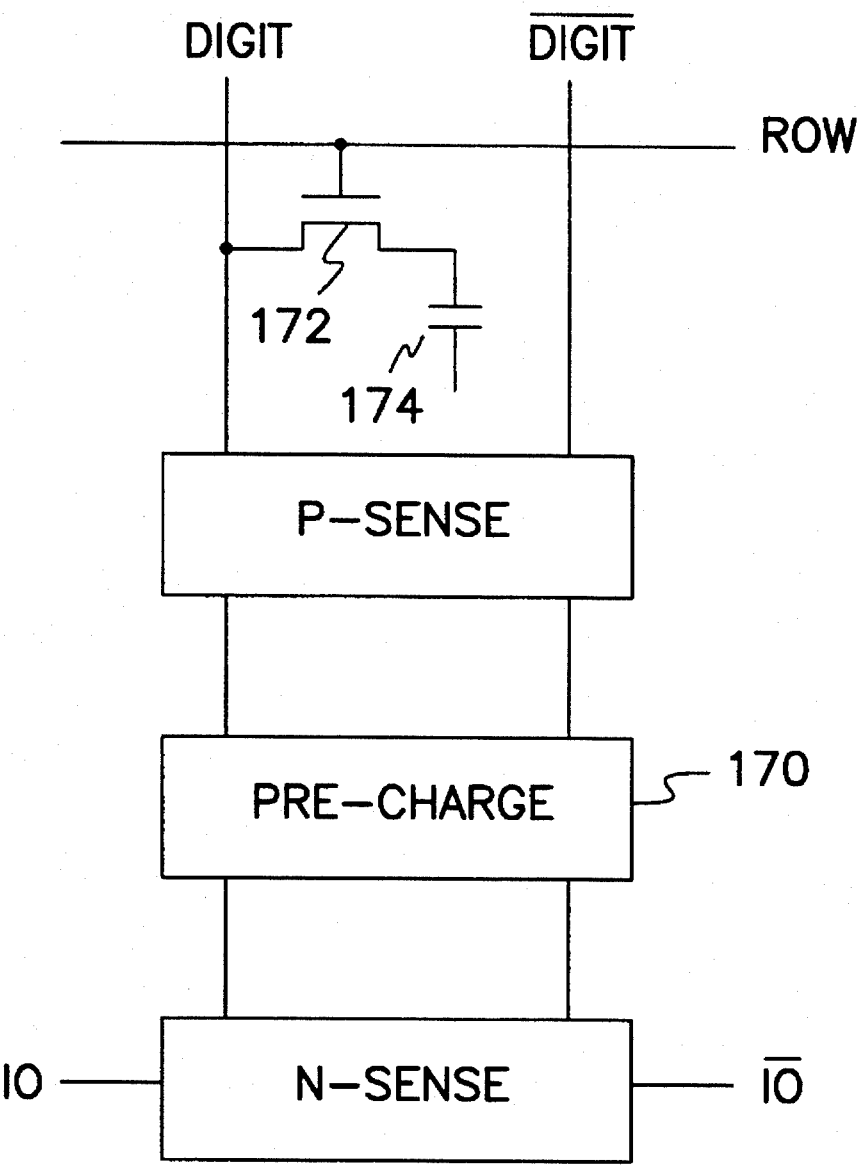
FIG. 7 is a diagram of an array access circuit in a dynamic random access memory.

To understand the hand off operation, reference is made to FIG. 7 which is a simplified illustration of one cell of a memory array and accompanying access circuitry. In a standard multiple function operation, the pre-charge circuit 170 maintains a pre-charge on Digit and Digit complement (Digit*) lines while RAS* is high. When RAS* falls the pre-charge begins to shut off. Also, as detailed above, the function to be is determined when RAS* falls by timing generator and control logic 144 via TR*/OE*, ME*/WE*, CAS* and DSF. The selected row of the memory, as indicated by the address present when RAS* fell, goes high to activate access transistor 172 and dump the charge stored on memory cell 174 onto the digit line. Both the p-sense and n-sense amps are activated shortly after the memory cell has been accessed. During this activation time the digit lines can be manipulated. That is, the charge stored in the memory cell is relatively small and can be easily overcome prior to the activation of the sense amps. Write transfer and flash write functions are performed during this time period, as described below.

After the memory cell has been accessed, the digit lines are driven to full rail by the sense amps based upon the charge stored on the memory cell. A HANDOFF* signal goes low following a time delay triggered by RAS* falling. The first CAS* falling edge while RAS* is low triggers the desired function as determined by timing generator and control logic 144. If that is the only function desired, both CAS* and RAS* will return high. If the desired function is either a LMR, LCR, WT, or SWT function it can be followed by a page mode function (RW, RWM, BW, BWM) without closing the RAS* cycle, see Table 2. This is accomplished by using a page mode enable circuit 175 similar to that shown in FIG. 8 to disable the page mode functions until the second falling edge of CAS*.

Figure 8:
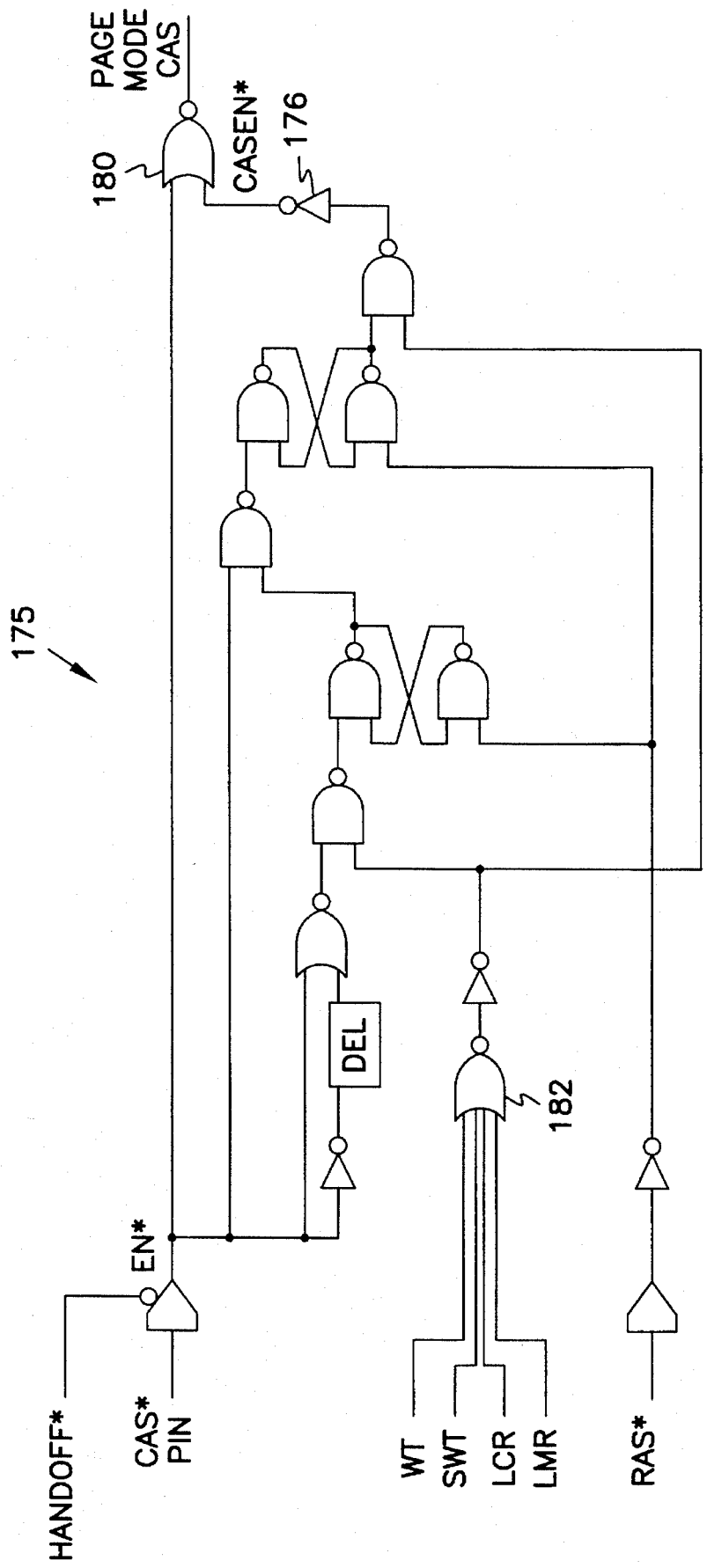
FIG. 8 is a schematic diagram of a page mode enable circuit.
Figure 9:
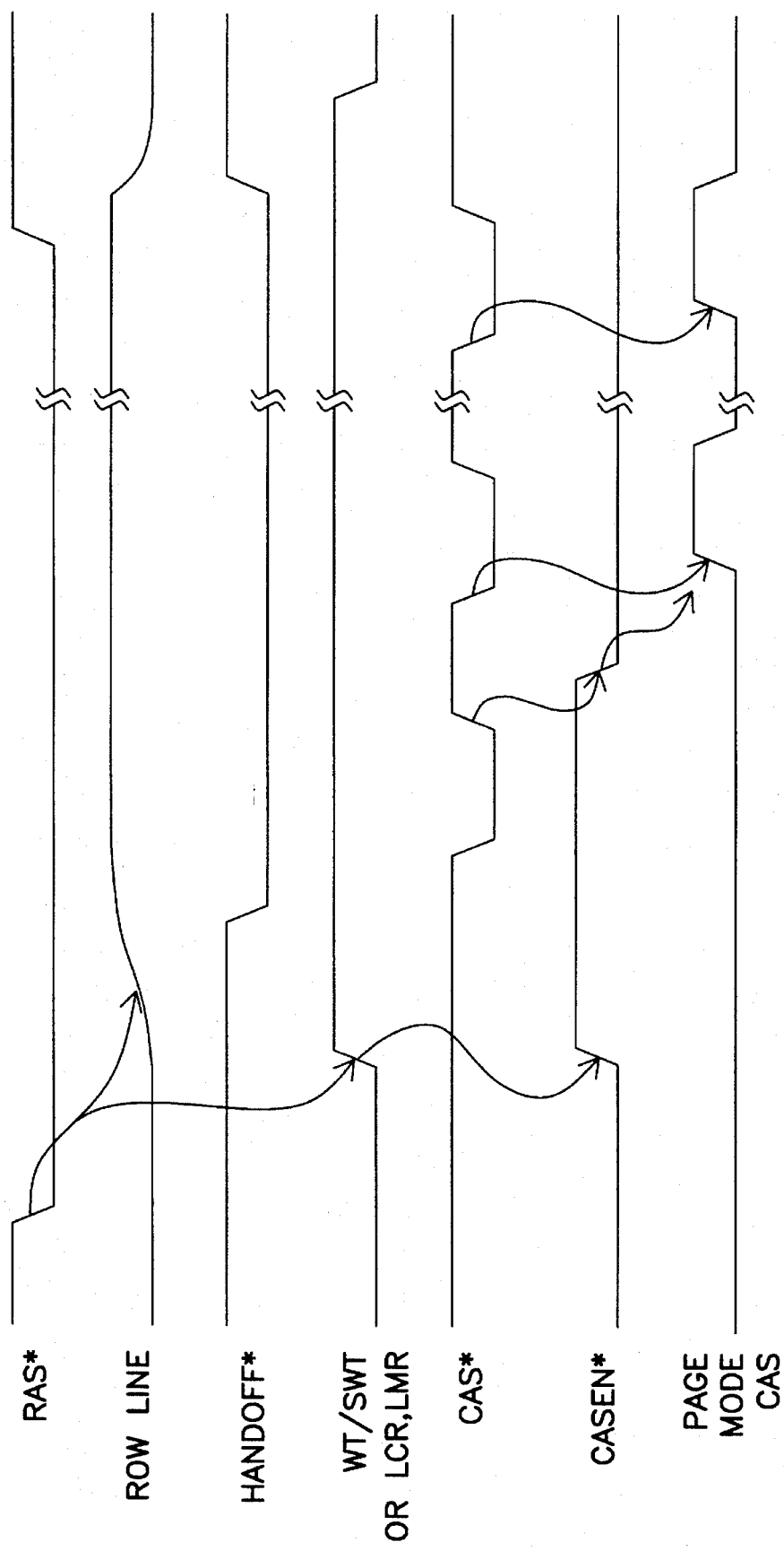
FIG. 9 is a timing diagram of the circuit of FIG. 7.

Referring to FIGS. 8 and 9, the page mode enable circuit 175 is described. CASEN*, the output of inverter 176, is normally low such that the output of NOR 180 follows the inverse of CAS*. When CAS* goes high, however, NOR 180 is latched to a low state. As seen in FIG. 9, after RAS* has gone low, an input to NOR 182 goes high if either LMR, LCR, WT, or SWT are selected. CASEN* then goes high in response to NOR 182. The row line begins to be activated and the HANDOFF* line goes low following a small delay.

TABLE 2

| | | CAS* FALLING EDGE | | |
|---|---|---|---|---|
| CODE | FUNCTION | TR*/OE* | ME*/WE* | DSF |
| | PAGE MODE FUNCTIONS | | | |
| RW | Normal DRAM Read or Write | 1 | 1 | 0 |
| RWM | Masked Write to DRAM | 1 | 0 | 0 |
| BW | Block Write to DRAM | 1 | 1 | 1 |
| BWM | Masked Block Write to DRAM | 1 | 0 | 1 |

On the first CAS* falling edge the output of NOR 180 (Page Mode CAS) remains low. The first rising edge of CAS* resets CASEN* to a low state. The Page Mode CAS, therefore, follows the inverse of CAS* on successive CAS* cycles. RAS* returns high when the desired page mode functions are completed.

To fully utilize the multiple function operation, the first function should be completed as fast as possible. This function is preferably performed in one of three ways. The first is for performing write transfer functions, either a WT or a SWT. For these functions the SAMs are coupled to the digit lines via the transfer gates 128 or 130 after the pre-charge circuits turn off and before the sense amps strobed. After the sense amps are strobed, the SAMs are decoupled using trigger circuit 164. The first falling edge of CAS* can be used to trap a tap address for the serial counter for outputting data from the SAMs. Page mode functions can ensue on successive CAS* cycles, see Table 2.

Flash write functions are performed in a different manner than the write transfer functions. The SAMs are not coupled to the digit lines during a FWM function. Instead, the color register is coupled to the p-sense amps after the precharge circuits turn off and before the sense amps strobed. U.S. Pat. No. 5,305,263 to Morgan describes a technique for coupling the color register through the p-sense amps, and is entirely incorporated herein by reference. As with the WT and SWT functions, the transfer is complete prior to HANDOFF* going low. Because the CASEN* remains low during flash write functions, it is possible for page mode functions to begin on the first CAS* falling edge following a FWM function.

For LCR and LMR functions, the respective registers are loaded on the first falling edge of CAS*, as detailed above. Page mode functions can then follow on successive CAS* cycles.

Mask Write followed by Page Mode Read/Write

Figure 5:
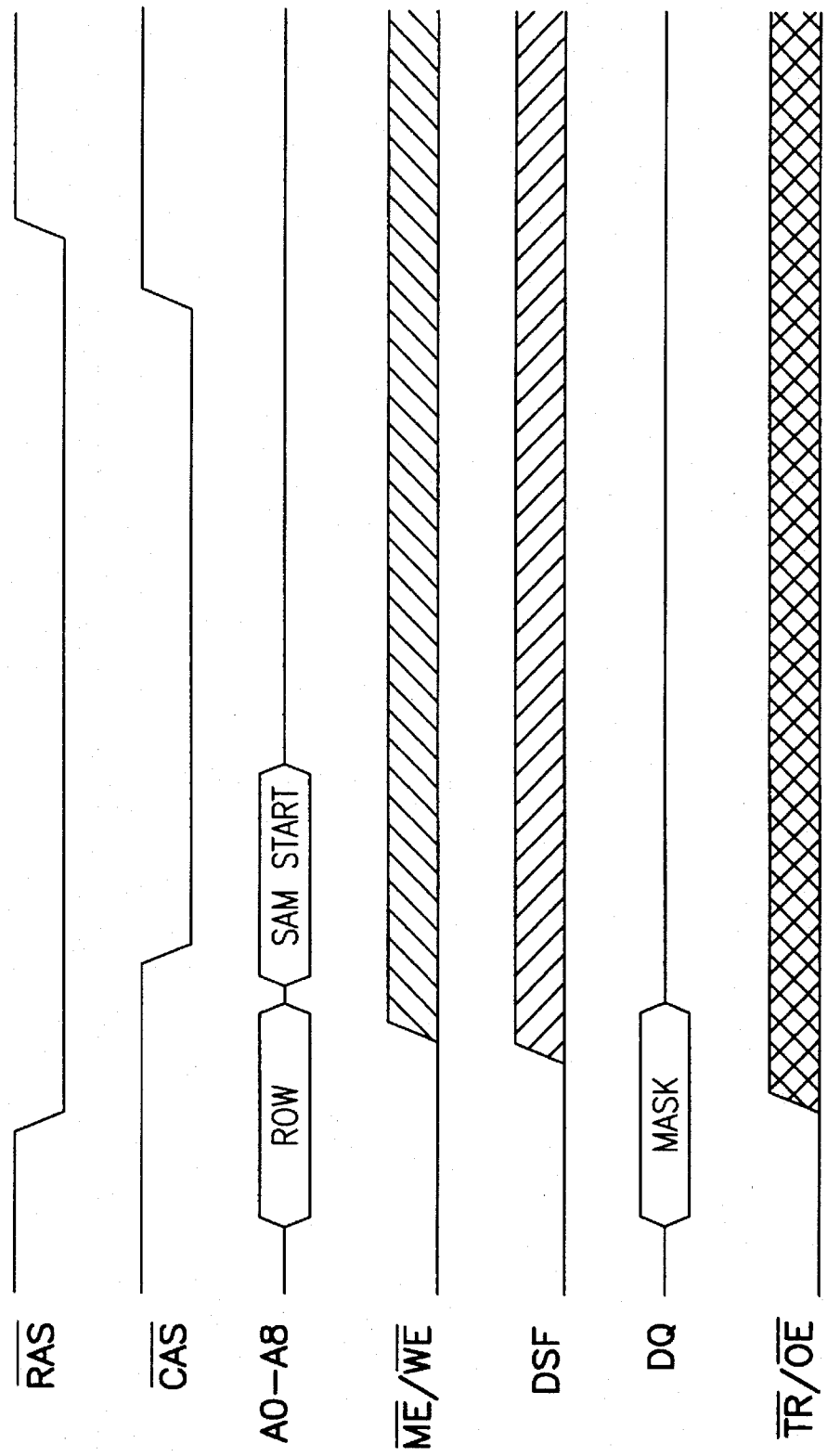
FIG. 5 is a timing diagram of a prior art masked write transfer.
Figure 6:
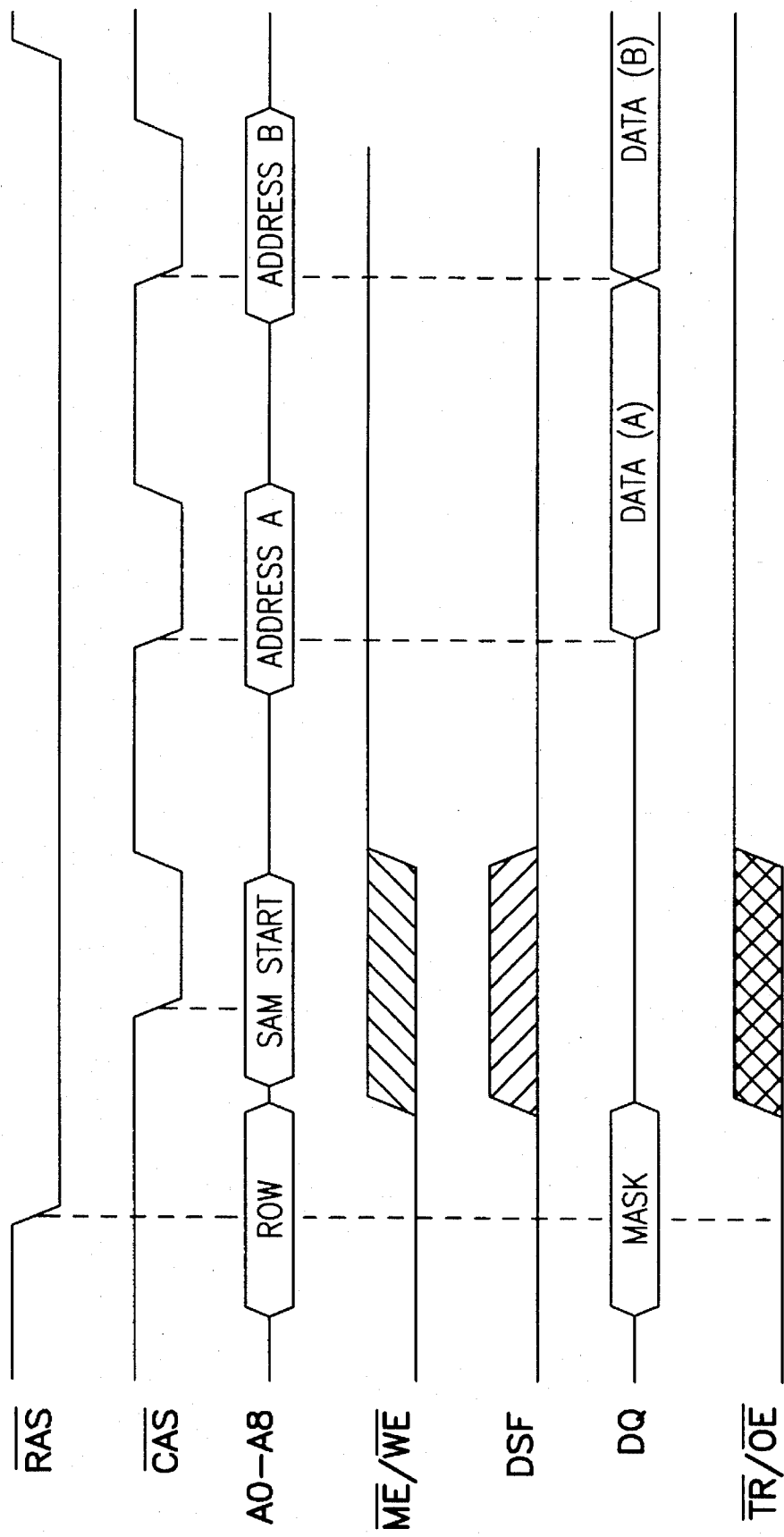
FIG. 6 is a timing diagram of a masked write transfer followed by a page mode read.

To better illustrate this feature of the invention, reference is made to FIGS. 5 and 6 illustrating a prior art masked write transfer and a masked write transfer followed by a RW function of the present invention, respectively. The masked write transfer of FIG. 5 is initiated when RAS* goes low and ME*/WE* is low, DSF is low, TR*/OE* is low, and CAS* is high, see Table 1. RAS* going low signals to the DRAM the presence of a valid row address at A0 to A8. RAS* also inputs a bit plane mask from the DQ inputs to the mask register 156 to be applied to transfer gates 128 and 130 as describe above. When CAS* goes low, data is transferred from the SAM to the DRAM. RAS* returns to a high state upon the completion of the transfer. If the newly transferred data is to be randomly accessed, RAS* must return low and a new function performed.

FIG. 6 illustrates a masked write transfer immediately followed by a page mode read function on some of the same data without closing the row. The masked write transfer function, as described above, is initiated when RAS* goes low and ME*/WE* is low, DSF is low, TR*/OE* is low, and CAS* is high. Page mode enable circuit 175 disables page mode functions. RAS* going low signals to the VRAM the presence of a valid row address at A0 to A8 and loads the mask register 156. Data is transferred from the SAM to the DRAM. Upon completion of the transfer, the transfer gate between the SAM and the DRAM is disabled by trigger circuit 175 as detailed above. The first CAS* cycle is used to load a new tap address. The rising edge of CAS* enables page mode and the strobe function is then handed off to CAS* such that when CAS* goes low the inputs are strobed to determine what function is to be performed. Upon the second falling edge of CAS*, DSF is low, TR*/OE* is high, and ME*/WE* is high. The status of the inputs indicate a page mode read/write function (RW), see Table 2. The falling CAS* also notifies the DRAM of the presence of a valid column address (A) at address lined A0–A8. Data (A) present at column address (A) is connected to the DQ lines. When CAS* goes high, the data remains available on the DQ lines until the next low transition of CAS*. This low transition can be used to read/write data B from another address from address (B) as illustrated. It can be seen that by toggling CAS* different addresses can randomly be accessed on a page indicated by the accessed row.

The mask write transfer function followed by a page mode read/write function illustrates one multiple function using the multi-port memory of the present invention, however, it will be understood by one skilled in the art that any transfer function between a SAM and the DRAM can be immediately followed by any random access function. Further, this memory is not limited to transfer functions; any register, transfer, or flash write function of Table 1 can be performed during a RAS* cycle and be immediately followed by any of the page mode functions using CAS* cycles.

Flash Write followed by Page Mode Read/Write

Figure 10:
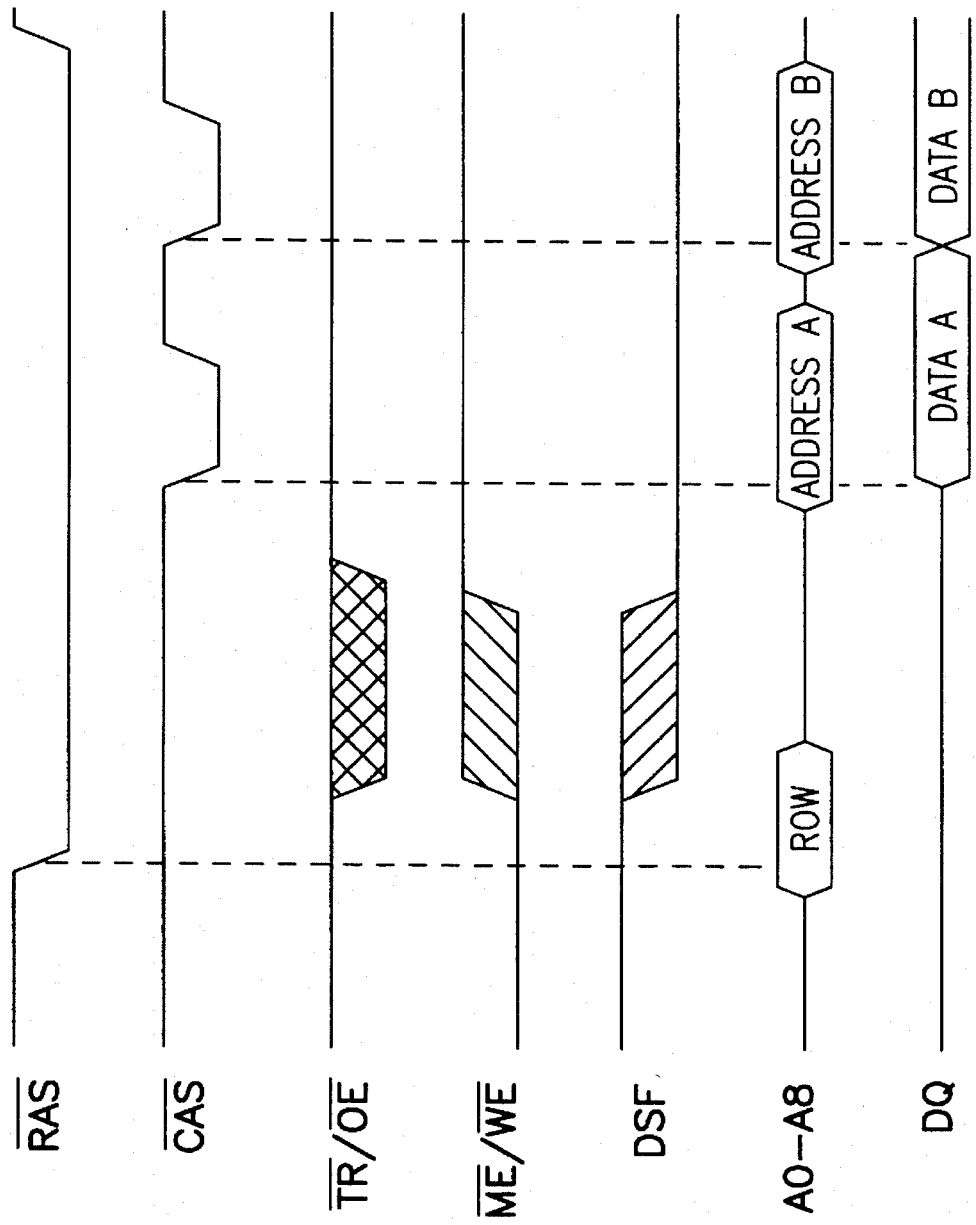
FIG. 10 is a timing diagram of a flash write function followed by a page mode function.

FIG. 10 illustrates the timing of a flash write followed by a page mode read/write function. As detailed above, when RAS* falls, the inputs indicate a flash write function from Table 1. The color register is connected to the p-sense amps such that an entire row, identified on address lines, is written to a state stored in the color register. CAS* cycles occurring during the RAS* cycle can then be used to perform page mode functions of Table 2, such as the page mode read/write.

Load Color Register followed by Page Mode Read/Write

Figure 11:
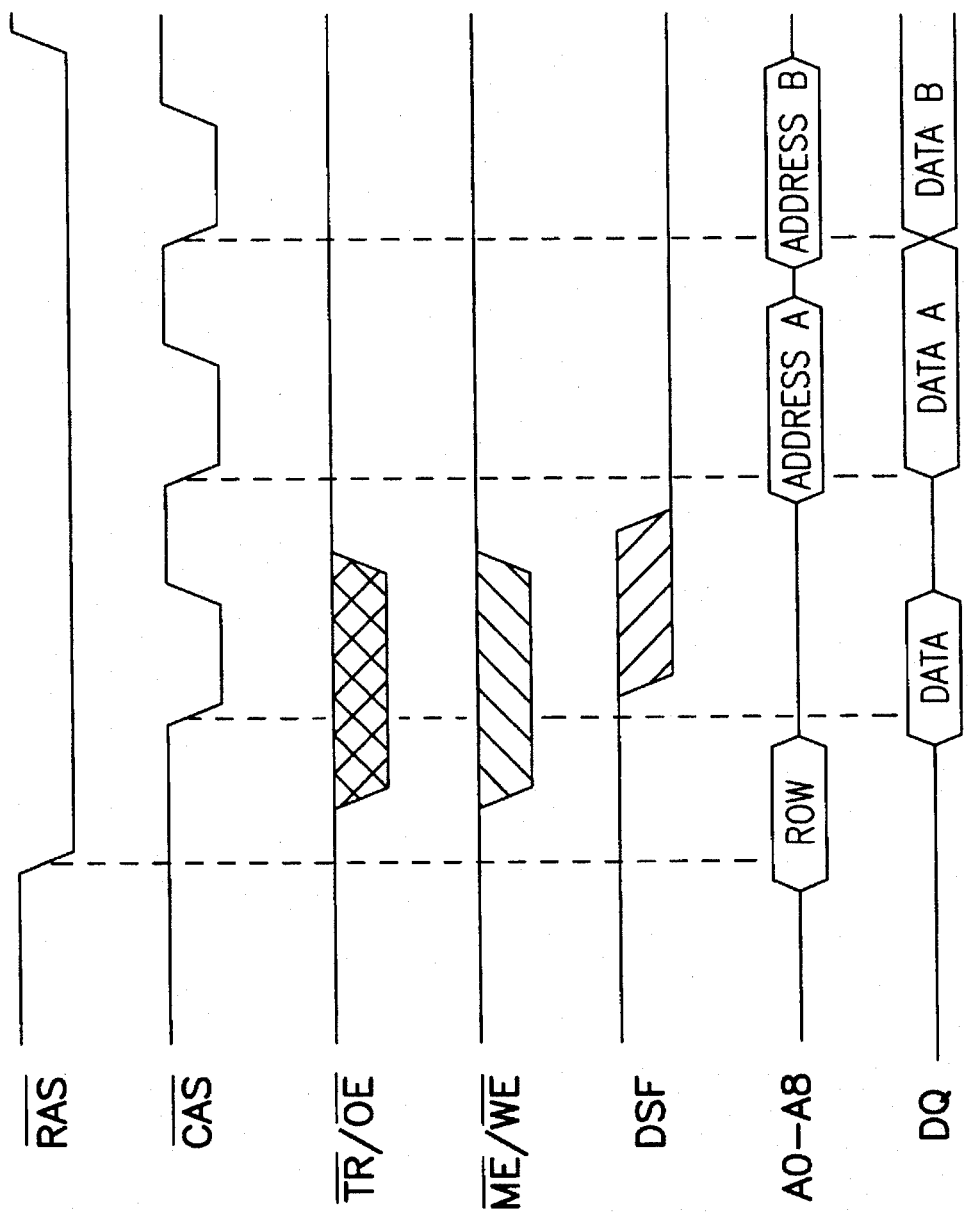
FIG. 11 is a load color register function followed by a page mode function.

FIG. 11 illustrates the timing of a load color register function followed by a page mode read/write function. When RAS* falls, the inputs define a LCR function and disables the page mode functions. The first CAS* cycle loads the color register with data from the DQ lines. When CAS* goes high, the page modes are enabled and successive CAS* cycles can be used to perform page mode functions, such as page mode read/write.

The LCR function followed by a page mode read/write function illustrates one multiple function using the present invention, however, it will be understood by one skilled in the art that any register function can be immediately followed by any page mode functions of Table 2.

Page Mode Editable Real Time Read Transfer

The present invention describes a new multi-port real time read transfer function associated with performing page mode functions, including edits, to a row of DRAM data before the data is transferred to a SAM register. Upon completion of edits to the row of DRAM the data is immediately transferred to the SAM register without a pre-charge cycle. A method is described for trapping a new tap address (start address) for the serial port upon the first falling edge of CAS*, and then allowing page mode to proceed upon successive CAS* cycles. This real time read transfer function requires the TR*/OE* pin to be held low until the row of DRAM data is to be transferred to the SAM register. The data is then transferred upon the TR*/OE* pin transitioning high.

One application for the present invention is for system parity bits. That is, the parity for a given memory segment of a DRAM row could be generated and then written to other bits associated with the same row immediately before to entire row of data is transferred. This method avoids the pre-charge time associated with related art approaches, while keeping the data and parity bits on the same row. Related art teaches a method of inhibiting random access cycles (or Page Mode) during Read transfers, see U.S. Pat. No. 4,689,741, supra. A method and apparatus are described herein which allow random access to the DRAM row of data and then transfer the data upon an external signal transition, without having to pre-charge the row before the transfer.

Figure 12:
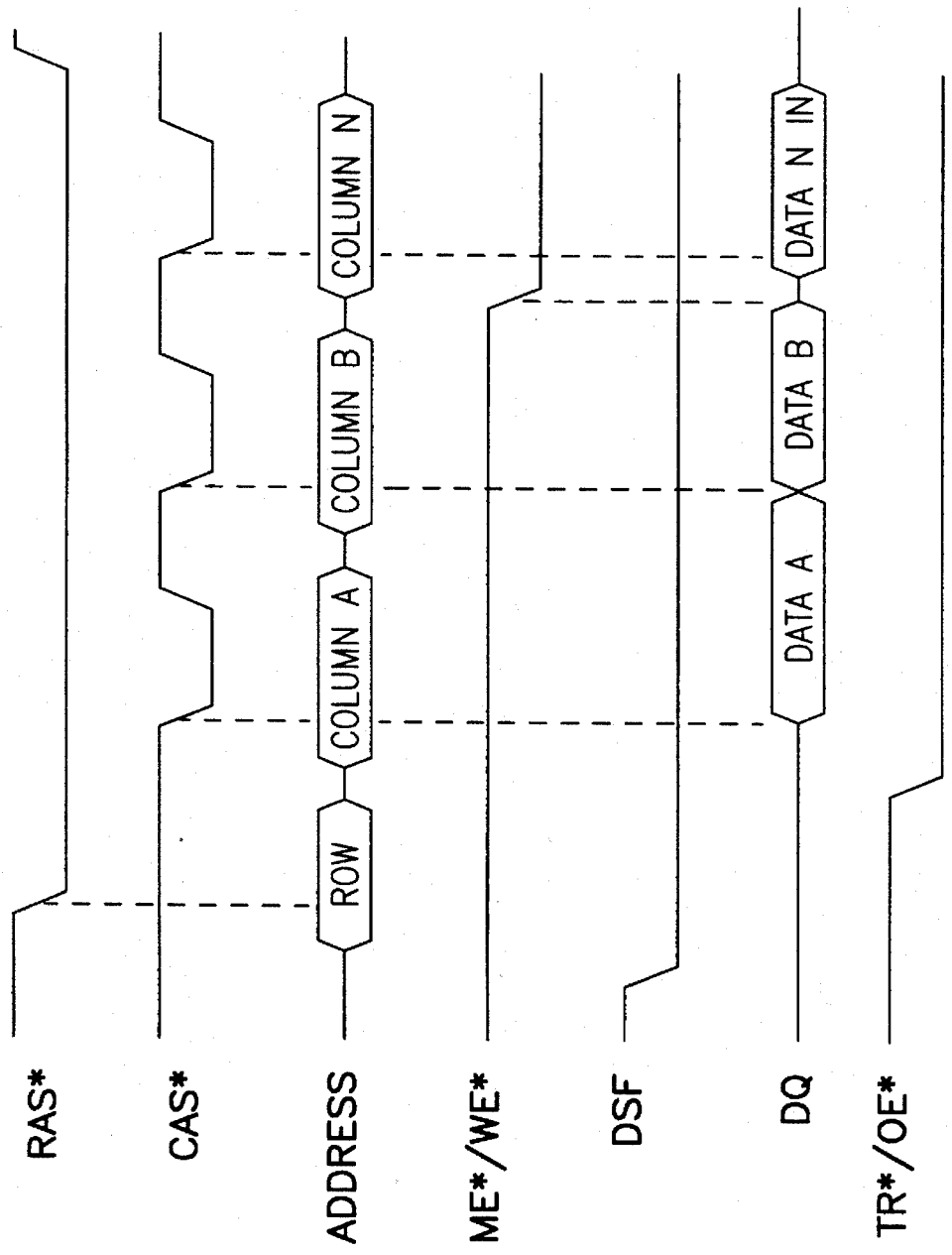
FIG. 12 is a prior art timing diagram for a read transfer operation from a DRAM to a SAM.

Referring to FIG. 12, a typical timing diagram for a DRAM Fast page mode Read/Write timing is shown, as is well known in the art. This method of editing a page of DRAM requires that a memory row be pre-charged and then opened during a RAS* cycle. The external inputs are evaluated by the controller 144 on the falling edge of RAS* to determine which operation is to be performed. The inputs shown in FIG. 12 indicate that a either Read/Write, Mask Write, Block Write, or Masked Block Write operation is to be performed, see Table 1. On the first CAS* cycle, the inputs are again evaluated by the controller and further indicate that either a Read/Write, or Mask Write is to be performed. During the first two CAS* cycles, Columns A and B are read, respectively, such that the data stored at these addresses are provided as valid output data on the DQ outputs. The ME*/WE* line is held high when these CAS* cycles begin to indicate that a Read operation is to be performed. During the third CAS* cycle, the ME*/WE* input is low to indicate that a Write operation is to be performed. The input data present on the DQ lines is then written to the memory cells at column N. When all of the page mode Read/Write operations are complete, the RAS* cycle is ended.

Figure 13:
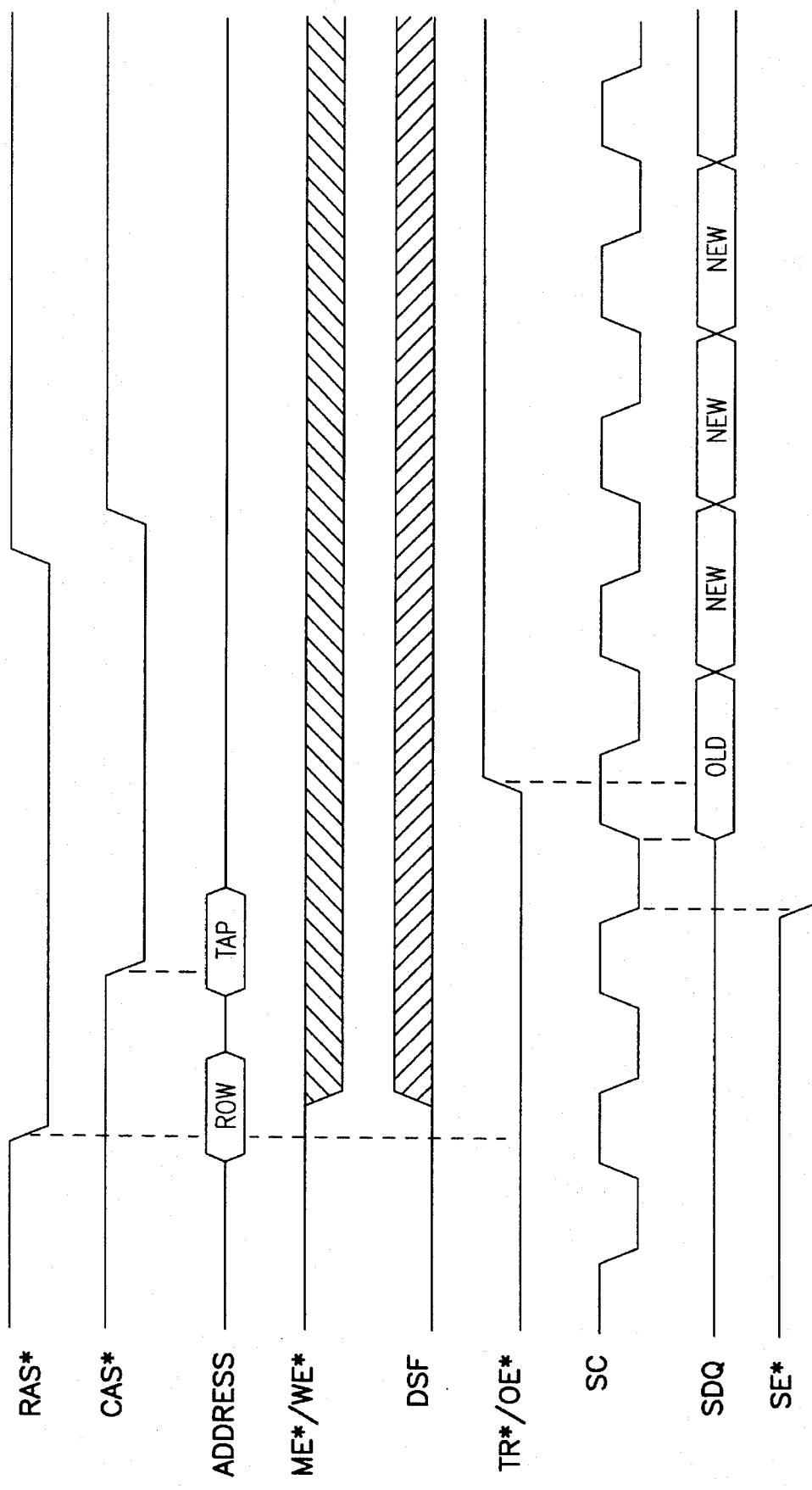
FIG. 13 is a prior art timing diagram for a fast page mode read/write operation in a DRAM.

To transfer the data which was just written to column N in FIG. 12, the row must be pre-charged again to equilibrate the Digit lines and addressed during a RAS* cycle, as shown in FIG. 13. The inputs on the falling edge of RAS* in FIG. 13 indicate that a Read Transfer operation is to be performed, see Table 1. On the first CAS* cycle, the address lines are used to load the serial memory tap address. The tap address indicates the SAM address where the data stored in the SAM begins to be output on the SDQ lines. The TR*/OE* line goes high during the CAS* cycle such that the data transfer can be synchronized with the serial clock, SC. To edit a row of DRAM data and then transfer that data to the SAM, therefore, two RAS* cycles and two pre-charges are required, as shown in FIGS. 12 and 13. That is, first the steps set forth in FIG. 12 must be completed, and then the steps in FIG. 13 must be completed.

Figure 14:
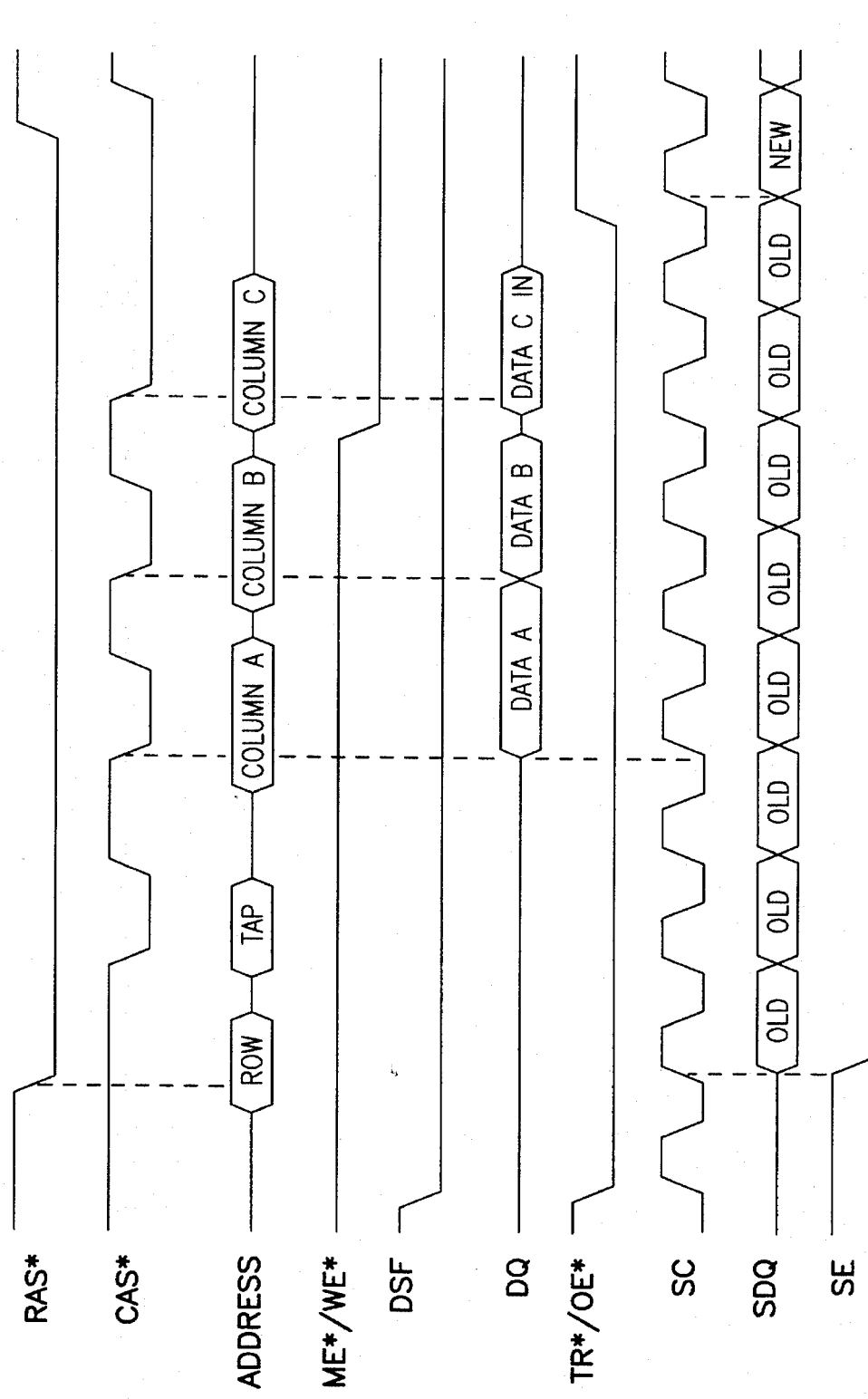
FIG. 14 is a timing diagram for a page mode read/write and real-time transfer of the present invention.

FIG. 14 shows a "Real Time Read Transfer" where the first falling edge of a CAS* cycle traps the SAM Start Address then three more CAS* cycles occur, two reads from columns A and B, then a write is performed to column C. When the TR*/OE* line goes high following the page mode read and write functions, the transfer of data from the DRAM row to the SAM occurs. While the TR*/OE* is low, the system clock (SC) pulses old data out of the serial port. That is, data which was previously transferred to the SAM. The new data is not available on the serial port until after the transfer of new data is complete.

Figure 15:
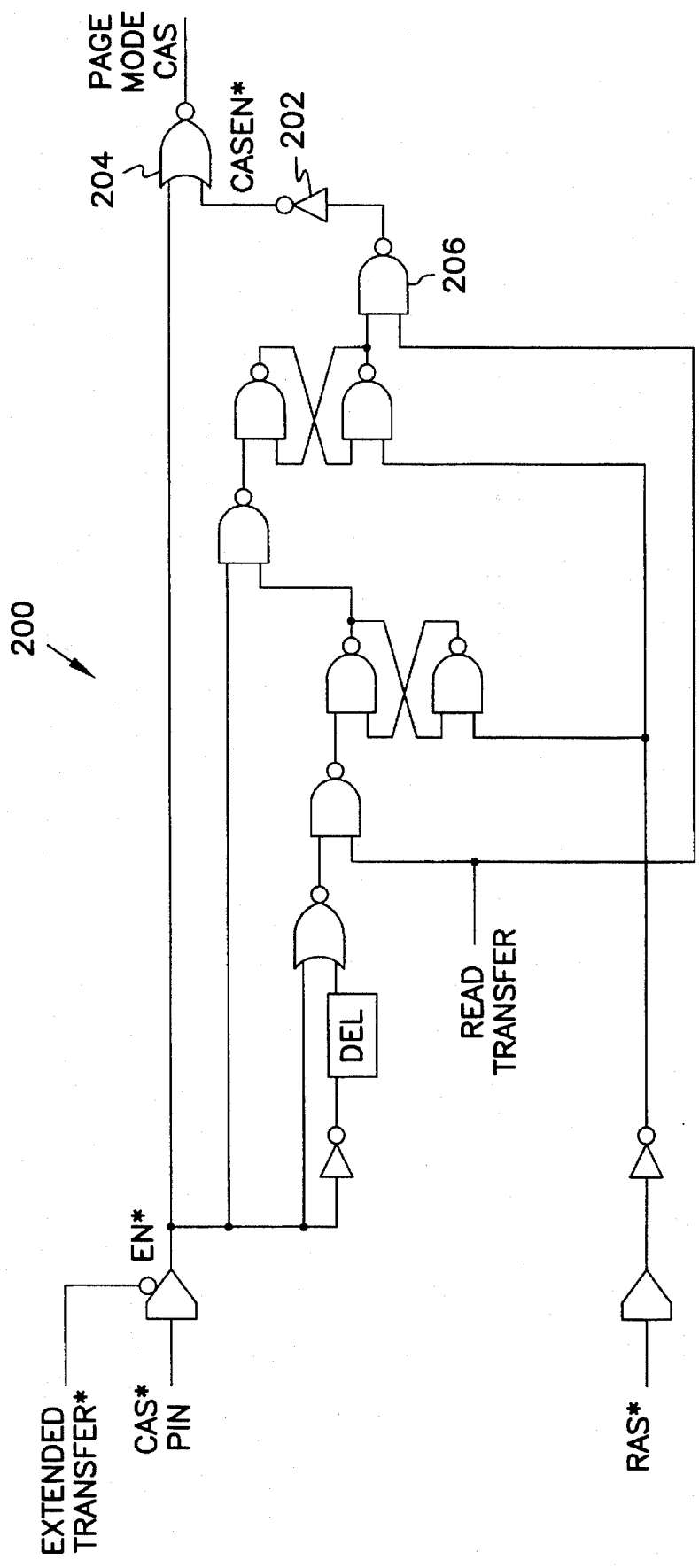
FIG. 15 is a control circuit for use with the page mode read/write and real-time transfer of FIG. 14.

FIGS. 15 describes a page mode enable circuit used to hold off page mode functions until the second falling edge of CAS* so that the first falling edge of CAS* can be used to trap the SAM start address. The circuit of FIG. 15 is similar to the circuit described in FIG. 8. A transfer mode enable circuit 200 is described where CASEN*, the output of inverter 202, is normally low such that the output of NOR gate 204 follows the inverse of CAS*

When the RAS* line goes low, a row address is provided on the address lines and the addressed row line is activated. An Extended Transfer* input signal is used to indicate when the real time read transfer operation is to be used and enables the page mode enable circuit. The Extended Transfer* input, therefore, goes low after the RAS* falling edge. After RAS* has gone low and the inputs, including Extended Transfer*, to the memory circuit are strobed and evaluated by the controller 144 to indicate that a Real Time Read Transfer operation is desired. A Read Transfer signal line goes high in response to the controller. The output of NAND gate 206 goes low, and CASEN* goes high in response to read transfer. The output of NOR 204 is therefore latched low. On the first CAS* falling edge, the output of NOR 204 remains low. The first rising edge of CAS*, however, resets CASEN* to a low state. The Page Mode CAS then follows the inverse of CAS* on successive CAS* cycles. The TR*/OE* line goes high after the page mode functions are complete to transfer data from the DRAM addressed row to the SAM. After the transfer is complete, the RAS* cycle is ended.

Table 3 shows the state of the inputs for either a page mode Read or page mode Write operation during the real time read transfer mode. During the CAS* cycles, or Page Mode CAS cycles, the TR*/OE*, ME*/WE* and DSF inputs are used to indicate to the controller that the memory is to perform either a page mode Read or Write to the DRAM row. The controller, therefore, uses Page Mode CAS to trigger page mode functions while the memory is in a Real Time Read Transfer mode. The address lines are used to identify the column of the row which is to be accessed. The DQ lines are used to either read the data from the DRAM or write the data thereto. After the TR*/OE* line goes high, the accessed DRAM row is transferred to the SAM. As stated above, the first CAS* falling edge identifies the tap address, therefore, the SDQ lines output the newly transferred data present in the SAM starting at the tap address.

TABLE 3

PAGE MODE CAS RISING EDGE

| FUNCTION | TR*/OE* | ME*/WE* | DSF | Extended Transfer* |
|---|---|---|---|---|
| PAGE MODE FUNCTIONS | | | | |
| Normal DRAM Read | 0 | 1 | 0 | 0 |
| Normal DRAM Write | 0 | 0 | 0 | 0 |

It will be understood that the tap address could be loaded at any time during the RAS* cycle prior to TR*/OE* going high, and does not have to be performed on the first CAS* cycle. Thus, a circuit could be used in place of the page mode enable circuit 200 to allow page modes and a read transfer to be performed during one RAS* cycle where a page mode function is performed prior to the tap address being loaded.

Conclusion

A multi-port memory has been described which has a dynamic memory and a static memory. A circuit and method are detailed for allowing a row of dynamic memory to be read from or written to during a row access cycle and then transferring the dynamic memory row to the static memory. The circuit prevents page mode functions from being performed on the first CAS* cycle of a row access cycle, but allows page mode functions on subsequent CAS* cycles. As a result, DRAM data can be manipulated and then real time transferred to the serial memory.

What is claimed is:

1. A memory device comprising:
    a dynamic memory having memory cells arranged in a plurality of rows;
    a static memory selectively coupled to the dynamic memory;
    a data input coupled to the dynamic memory for transmitting new data to the dynamic memory; and
    a controller for accessing one of the plurality of rows of the dynamic memory during an access cycle, storing the new data in the accessed one of the plurality of rows during the access cycle, and transferring the new data from the accessed one of the plurality of rows to the static memory during the access cycle.

2. A method of performing a plurality of functions in a multi-port memory device having a random access memory (RAM) array arranged in a plurality of rows and columns, and at least one additional memory, the method comprising the steps of:
    addressing one row of the plurality of rows using a row access strobe (RAS) input;
    strobing additional inputs based upon the RAS input;
    disabling page mode functions;
    loading a serial tap address using a column access strobe (CAS) input;
    re-enabling page mode functions;
    performing read or write page mode functions;
    performing a transfer function to transfer data between the RAM and the at least one additional memory.

3. A memory device comprising:
    a dynamic memory having memory cells arranged in a plurality of rows and columns;
    a static memory selectively coupled to the dynamic memory;
    an addressing means for addressing one of the plurality of rows during an access cycle;
    a transfer means for transferring data between the dynamic memory and the static memory; and
    a control means adapted to enable both data transfer via the transfer means during the access cycle and random access read or write operations on the dynamic memory during the access cycle.

4. A method of internally transferring data in a memory device comprising a dynamic memory and at least one additional memory, the method comprising the steps of:
    addressing one row of the dynamic memory;
    randomly accessing the dynamic memory;
    transferring data between the dynamic memory and the at least one additional memory; and
    closing the one row of the dynamic memory, wherein the randomly accessing step and the transferring data step occur subsequent to the addressing step and prior to the closing step.

5. The method of claim 4 wherein the step of randomly accessing the dynamic memory includes reading data from the dynamic memory and writing data to the dynamic memory.

6. The method of claim 4 wherein the one additional memory is a static memory.

7. A memory device comprising:
    a dynamic memory having memory cells arranged in a plurality of rows and columns;
    a static memory selectively coupled to the dynamic memory;
    a row access strobe input (RAS) for addressing one of the plurality of rows; and
    a controller for both randomly accessing the addressed one of the plurality of rows and transferring data between memory cells of the addressed one of the plurality of rows and the static memory during one cycle of the row access strobe.

8. The memory device of claim 7 further including:
    a column access strobe (CAS) input to address at least one of the plurality of columns;
    a serial memory tap address register; and
    a real time read transfer circuit which inhibits a cycle of the column access strobe (CAS) input to load data into the serial memory tap address register.

9. The memory device of claim 8 wherein the real time read transfer circuit produces an output coupled to the controller for strobing additional inputs.

10. The memory device of claim 8 wherein the real time read transfer circuit includes an input for enabling the real time read transfer circuit.

11. The memory device of claim 8 wherein the real time read transfer circuit comprises isolation circuitry for isolating the RAM from the static memory.

12. The memory device of claim 11 wherein the isolation circuitry comprises a time trigger circuit coupled with the real time read transfer circuit.

13. A method of performing a plurality of functions in a memory device having a random access memory (RAM) having memory cells arranged in a plurality of rows and columns, and at least one additional memory, the method comprising the steps of:

addressing one row of the plurality of rows using a row access strobe (RAS) input;

strobing additional inputs based upon the RAS input;

accessing at least one column of the plurality of columns using a column access strobe (CAS) input;

performing a random access operation on the RAM during the RAS cycle; and transferring data between the RAM and the at least one additional memory during the RAS cycle.

14. The method of performing a plurality of functions in a memory device according to claim 13 wherein the performing a random access operation step comprises reading the data stored in the memory cells of the RAM.

15. The method of performing a plurality of functions in a memory device according to claim 13 wherein the performing a random access operation step comprises writing data to the memory cells of the RAM.

16. The method of performing a plurality of functions in a memory device according to claim 13, wherein the transferring step comprises the steps of: reading data from the RAM; and storing the data to the at least one additional memory.

17. The method of performing a plurality of functions in a memory device according to claim 13, wherein the transferring step comprises the step of: reading data from the at least one additional memory; and storing the data to the RAM.

18. The method of performing a plurality of functions in a memory device according to claim 13 wherein the performing a random access operation step comprises editing the data stored in the memory cells of the RAM.

19. The method of performing a plurality of functions in a memory device according to claim 18 wherein the editing step comprises the step of writing cells of the RAM with data masked by a mask register.

20. The method of performing a plurality of functions in a memory device according to claim 18 wherein the editing step comprises the step of writing cells of the RAM with data masked by a color register.

* * * * *